United States Patent
Akiyama et al.

(10) Patent No.: US 10,960,496 B2
(45) Date of Patent: Mar. 30, 2021

(54) SOLDER ALLOY AND PACKAGE STRUCTURE USING SAME

(71) Applicant: Panasonic Intellectual Property Management Co., Ltd., Osaka (JP)

(72) Inventors: Shinnosuke Akiyama, Osaka (JP); Kiyohiro Hine, Osaka (JP); Hidetoshi Kitaura, Osaka (JP); Akio Furusawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 285 days.

(21) Appl. No.: 15/582,507

(22) Filed: Apr. 28, 2017

(65) Prior Publication Data

US 2017/0334026 A1 Nov. 23, 2017

(30) Foreign Application Priority Data

May 18, 2016 (JP) .............................. JP2016-099816

(51) Int. Cl.
*B23K 35/26* (2006.01)
*C22C 13/00* (2006.01)
*H05K 1/18* (2006.01)

(52) U.S. Cl.
CPC ............ *B23K 35/262* (2013.01); *C22C 13/00* (2013.01); *H05K 1/182* (2013.01); *H05K 2201/10022* (2013.01)

(58) Field of Classification Search
CPC ................. B23K 35/262; H05K 1/182; H05K 2201/10022
See application file for complete search history.

(56) References Cited

U.S. PATENT DOCUMENTS 5,733,501 A * 3/1998 Takao .................. B23K 35/262
420/557
6,224,690 B1 * 5/2001 Andricacos ............ B32B 15/01
148/400
(Continued)

FOREIGN PATENT DOCUMENTS

CN 106715040 A 5/2017
JP 5280520 B 9/2013
(Continued)

OTHER PUBLICATIONS

Tay, S.L., et al. "Effect of Addition Cobalt Nanoparticles on Sn—Ag—Cu Lead-Free Solder." 2010 12th Electronics Packaging Technology Conference, 2010 (Year: 2010).*
(Continued)

*Primary Examiner* — Paul A Wartalowicz
*Assistant Examiner* — Ryan L Heckman
(74) *Attorney, Agent, or Firm* — Panasonic IP Management; Kerry S. Culpepper

(57) ABSTRACT

There is provided a solder alloy in which 0.5 mass % or more and 1.25 mass % or less of Sb, In satisfying the following formula (I) or (II) when [Sb] is set as a Sb content percentage (mass %) and [In] is set as an In content percentage (mass %): in a case of 0.5≤[Sb]≤1.0, 5.5≤[In]≤5.50+1.06[Sb] . . . (I), in a case of 1.0<[Sb]≤1.25, 5.5≤[In]≤6.35+0.212[Sb] . . . (II) (in the formula, [Sb] indicates a Sb content percentage (mass %) and [In] indicates an In content percentage (mass %)), 0.5 mass % or more and 1.2 mass % or less of Cu, 0.1 mass % or more and 3.0 mass % or less of Bi, 1.0 mass % or more and 4.0 mass % or less of Ag, and 0 mass % or more and 0.025 mass % or less of Co are contained, and has the remainder consisting essentially of Sn.

5 Claims, 3 Drawing Sheets

(56) References Cited

U.S. PATENT DOCUMENTS

| | | | |
|---|---|---|---|
| 8,968,488 B2* | 3/2015 | Yamashita | B23K 1/0016 |
| | | | 148/24 |
| 2011/0120769 A1 | 5/2011 | Sakatani et al. | |
| 2015/0305167 A1 | 10/2015 | Nakanishi et al. | |
| 2016/0039052 A1 | 2/2016 | Furusawa et al. | |
| 2017/0282305 A1 | 10/2017 | Hine et al. | |

FOREIGN PATENT DOCUMENTS

| | | |
|---|---|---|
| JP | 5349703 B | 11/2013 |
| JP | 2016-215277 A | 12/2016 |
| JP | 6135885 B2 | 5/2017 |

OTHER PUBLICATIONS

The Extended European Search Report dated Oct. 19, 2017 for the related European Patent Application No. 17167866.7.
English Translation of Chinese Search Report dated Jun. 2, 2020 for the related Chinese Patent Application No. 201710331879.1.

* cited by examiner

SOLDER ALLOY AND PACKAGE STRUCTURE USING SAME

BACKGROUND

1. Technical Field

The present disclosure relates to a solder alloy which is mainly used in soldering an electronic component to an electronic circuit board, and to a package structure using the solder alloy.

2. Description of the Related Art

Recently, electrical installation of a vehicle for realizing high efficiency of an engine or a comfortable in-vehicle space is in progress. Thus, the number of electronic devices mounted in a vehicle tends to increase, and it is important to secure high reliability for a load such as heat or impact.

Regarding such a request, high reliability is also required for a solder alloy itself used when an in-vehicle electronic device is mounted. The solder alloy has a melting point lower than that of a printed circuit board or an electronic device which is a connection member, and thus is easily and significantly influenced by heat. For example, in a high-temperature environment, mechanical characteristics are significantly degraded by an influence such as growth of a structure in solder. Further, constituent members have a linear expansion coefficient different from each other. Thus, a temperature change is repeatedly received, and stress is concentrated on a solder bonding portion. Thus, a crack may occur. Accordingly, a substance which has high strength and ductility and has resistance against a repeated temperature change in a high-temperature environment is required as a solder alloy used when an in-vehicle electronic device is mounted.

As a solder alloy of the related art having excellent thermal fatigue resistance, a solder alloy formed from 1.0 to 4.0 mass % of Ag, 4.0 to 6.0 mass % of In, 0.1 to 1.0 mass % of Bi, 1 mass % or less (except for 0 mass %) which is the total content of one type or more elements selected from a group consisting of Cu, Ni, Co, Fe, and Sb, and Sn as the remainder is known. In addition, an electronic component bonding body (package structure) in which a bonding portion formed by using the solder alloy causes an electrode portion of an electronic component, which includes copper, to be bonded to an electrode land of a board, which includes copper, and a space between the electrode portion of the electronic component and the electrode land of the board in the bonding portion is at least partially closed by a Cu—Sn intermetallic compound is known (Japanese Patent No. 5280520). Japanese Patent No. 5280520 discloses that, with the above configuration, it is possible to prevent an occurrence of fissure (crack) and extension in a temperature cycle test in a range of −40° C. to 150° C.

As another solder alloy having excellent thermal fatigue resistance, a solder alloy which is a tin-silver-copper solder alloy is known. The solder alloy is formed from tin, silver, copper, bismuth, nickel, and cobalt. With respect to the total amount of the solder alloy, a content percentage of silver is 2 mass % or more and 4 mass % or less, a content percentage of copper is 0.1 mass % or more and 1 mass % or less, a content percentage of bismuth is 0.5 mass % or more and 4.8 mass % or less, a content percentage of nickel is 0.01 mass % or more 0.15 mass % or less, and a content percentage of cobalt is 0.001 mass % or more and 0.008 mass % or less. Indium or antimony is added as other elements, and the content percentage of tin corresponds to a percentage of the remainder (Japanese Patent No. 5349703). Japanese Patent No. 5349703 discloses that, according to the solder alloy, it is possible to improve durability of a solder alloy in a temperature (cool and hot) cycle test in a range of −40° C. to 125° C.

SUMMARY

The inventors independently found that, regarding a Sn—Ag—Bi—In solder alloy, both of Sb and Cu are necessarily added, the In content percentage is strictly controlled for the Sb content percentage, and thus excellent thermal fatigue resistance is obtained at a high temperature which has not be considered in the related art, specifically, even at 175° C. The inventors found that Co was added to the solder alloy and thus excellent impact resistance was obtained, and completed a solder alloy according to the disclosure and a package structure using the same.

According to the disclosure, there is provided a solder alloy and a package structure using the solder alloy in which 0.5 mass % or more and 1.25 mass % or less of Sb, In satisfying the following formula (I) or (II) when [Sb] is set as a Sb content percentage (mass %) and [In] is set as an In content percentage (mass %): in a case of $0.5 \leq [Sb] \leq 1.0$, $5.5 \leq [In] \leq 5.50 + 1.06[Sb]$ ... (I), in a case of $1.0 < [Sb] \leq 1.25$, $5.5 \leq [In] \leq 6.35 + 0.212[Sb]$ ... (II), 0.5 mass % or more and 1.2 mass % or less of Cu, 0.1 mass % or more and 3.0 mass % or less of Bi, 1.0 mass % or more and 4.0 mass % or less of Ag, and 0 mass % or more and 0.025 mass % or less of Co are contained, and the remainder consists essentially of Sn.

According to the disclosure, a solder alloy and a package structure using the solder alloy which are excellent in thermal fatigue resistance in a high-temperature environment of 175° C. are realized.

DETAILED DESCRIPTION

Figure 1:
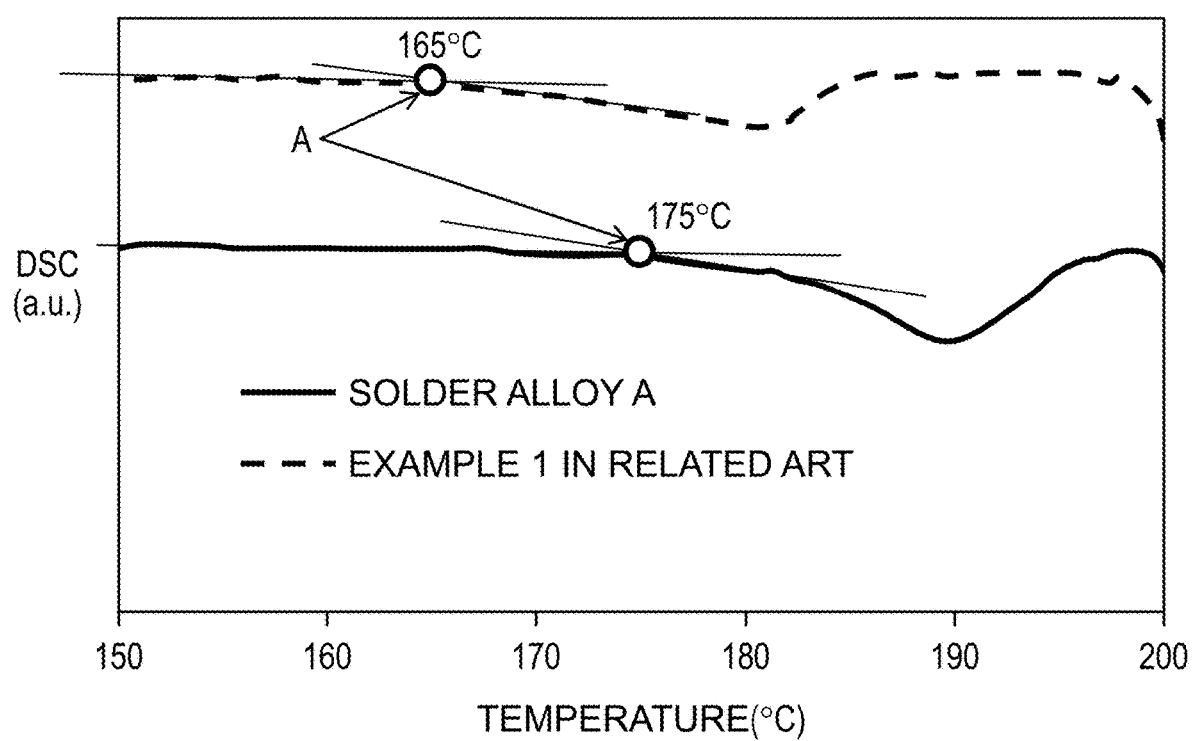
FIG. 1 is a diagram illustrating a DSC measurement result of a solder alloy according to an exemplary embodiment.

Ahead of descriptions for an exemplary embodiment, a problem in the related art will be simply described.

The number of electronic devices mounted in a vehicle tends to increase, and thus it is difficult to ensure a mounting space for the electronic devices in a limited space of the vehicle. Thus, a technique in which a mounting space is relatively expanded by reducing the size of an electronic device, or a technique in which an electronic device is mounted in an engine room of a high-temperature environment proceeds. As a result, heating density of an electronic device may be increased by reducing the size thereof, or a temperature in the surrounding environment may be increased. Thus, the electronic device is exposed in a high-temperature environment. Thus, in order to respond to forward evolution of the electronic device, a solder alloy which has high reliability, for example, high thermal fatigue resistance at a temperature higher than 125° C. or 150° C. which is used as the basis of the related art, specifically, even at a temperature of 175° C. is required.

Further, since a vehicle is impacted by vibration which normally occurs when an engine operates, resistance against an impact in a high-temperature environment is required. Thus, a solder alloy having impact resistance at a temperature of 175° C. is required.

However, using the solder alloy in a high-temperature environment described above is not considered in the related art. Specifically, regarding an using temperature, the solder alloy disclosed in PTL 1 is assumed to be used up to 150° C., and the solder alloy disclosed in PTL 2 is assumed to be used up to 125° C. Thus, it is considered that necessarily obtaining sufficient reliability is not possible at a temperature of 175° C.

To solve the above-described problem, an object of the disclosure is to provide a solder alloy which exhibits excellent thermal fatigue resistance even in a high-temperature environment of 175° C., and to provide a solder alloy which further has impact resistance in addition to the thermal fatigue resistance.

Hereinafter, a solder alloy according to one exemplary embodiment of the disclosure, and a package structure using the solder alloy will be described in detail with reference to the drawings.

In the specification, in a case of attaching [ ] to a symbol of an element constituting a solder alloy, [ ] is assumed to mean a content percentage (mass %) of the element in the solder alloy.

In this specification, when a metal structure of the solder alloy will be described, a numerical value or a numerical range may be shown just ahead of a metal element other than Sn. This means that mass % (=weight %) of each element occupied in a metal composition is indicated by a numerical value or a numerical range, and the remainder consists essentially of Sn, as is generally used in this technical field.

In the disclosure, "the solder alloy" may contain the fine amount of metal to be unavoidably mixed, as long as the metal composition is substantially configured by the exemplified metal. The solder alloy may have a certain form. For example, the solder alloy may be used singly or integrally with other component (for example, flux and the like) other than metal, in soldering.

The solder alloy according to this exemplary embodiment contains 0.5 mass % or more and 1.25 mass % or less of Sb, In satisfying the following formula (I) or (II): in a case of $0.5 \leq [Sb] \leq 1.0$, $5.5 \leq [In] \leq 5.50+1.06[Sb]$ ... (I), in a case of $1.0 < [Sb] \leq 1.25$, $5.5 \leq [In] \leq 6.35+0.212[Sb]$ ... (II) (in the formula, [Sb] indicates a Sb content percentage (mass %) and [In] indicates an In content percentage (mass %)), 0.5 mass % or more and 1.2 mass % or less of Cu, 0.1 mass % or more and 3.0 mass % or less of Bi, 1.0 mass % or more and 4.0 mass % or less of Ag, and 0 mass % or more and 0.025 mass % or less of Co, and the remainder consists essentially of Sn.

In the related art, an effect for physical properties influencing thermal fatigue resistance, such as strength or ductility of a solder alloy itself has not been clearly described. A complex effect in a case of containing a combination of Cu and Sb also has not been verified. Under this circumstance, the inventors found that research and development for mechanical characteristics in a high-temperature environment, which are required for an electronic device for a vehicle was performed, and as a result, each of In, Cu, and Sb was contained in a range having a certain specific relation, and thus the mechanical characteristics at a high temperature (which has not been clarified until now), particularly, ductility at a high temperature was improved, and thermal fatigue resistance was improved. Further, the inventors newly found that a defined amount of Co was contained in the solder alloy, and thus the ductility at a high temperature was further improved, and impact resistance is improved.

In order to clarify the effect of the solder alloy in this exemplary embodiment, a solder alloy (sample) having a predetermined composition was manufactured and evaluation was performed.

The sample to be evaluated in this exemplary embodiment was manufactured by the following method.

Regarding Sn, Ag, Bi, In, Cu, and Sb contained in a solder alloy, 3.5 mass % of Ag, 0.5 mass % of Bi, 6.0 mass % of In, 0.8 mass % of Cu, 0.5 mass % of Sb, 0.016 mass % of Co, and Sn as the remainder were weighted so as to cause the total to be 100 g.

The weighted Sn was put into a ceramics crucible. Adjustment to be temperature of 500° C. and a nitrogen atmosphere was performed, and the ceramics crucible was installed in an electric type jacket heater.

After it was confirmed that Sn was melted, In was put and stirring was performed for three minutes.

Bi was put, and stirring was performed for three minutes.
Ag was put, and stirring was performed for three minutes.
Sb was put, and stirring was performed for three minutes.
Cu was put, and stirring was performed for three minutes.
Co was put, and stirring was performed for three minutes.

Then, the crucible was picked up from the electric type jacket heater. The crucible was immersed in a vessel which was full with water of 25° C., so as to be cooled. Thus, a solder alloy was manufactured.

The manufactured solder alloy is referred to as "a solder alloy A" below, and an alloy composition thereof is represented by Sn-3.5Ag-0.5Bi-6.0In-0.8Cu-0.5Sb-0.016Co.

For comparison, as an example of a solder alloy in the related art, a solder alloy which had a composition of Sn-3.5Ag-0.5Bi-6.0In-0.5Cu was manufactured in a manner similar to the above descriptions. The solder alloy manufactured in this manner is referred to as "Example 1 in Related Art".

In order to evaluate a transformation temperature, 10 mg of the solder alloy manufactured in the above manner was picked up, and differential scanning calorimetry (DSC) was performed. The transformation temperature is a temperature at which phase transformation between β-Sn and γ rapidly proceeds. A temperature rising rate in measuring was set to 10° C./minute, and measurement was performed in a range of 25° C. to 250° C. FIG. 1 illustrates a result.

In FIG. 1, the transformation temperature was obtained by an inflection point of small peaks (A part) which are provided in a space from a low temperature (solid) side to a peak indicating a melting point. The transformation temperature of the solder alloy A was 175° C. The transformation temperature of Example 1 in Related Art was 165° C.

Then, 1 g of the solder alloy manufactured in the above manner was picked up. Soldering was performed on a Cu plate at 250° C. by using a commercial flux, and a temperature cycle test was performed. As a test condition, a temperature between −40° C. and 175° C. was set, and holding was performed at each of −40° C. and 175° C. for 30 minutes, for one cycle (a test having the condition is referred to as "the −40/175° C. temperature cycle test"). This process was performed for 500 cycles.

As a result, in the solder alloy A, self-transformation at a stage after 500 cycles was not viewed. However, in Example 1 in Related Art, self-transformation occurred. According to the above result, it is understood that, in a solder alloy having a transformation temperature of 175° C. or higher, self-transformation does not occur in the −40/175° C. temperature cycle test, and the solder alloy is proof against using at 175° C.

Then, in order to evaluate mechanical characteristics of the solder alloy, a tensile test in an environment of 175° C. was performed by using a tensile test piece. The tensile test piece was manufactured in a manner that the solder alloy manufactured in the above manner was put into a crucible, heating was performed at 250° C. in an electric type jacket heater, so as to be melted, and the molten solder alloy was caused to flow into a cast which was machined to have a shape of the tensile test piece and was formed of graphite. The tensile test piece had a round bar shape which had a narrowed portion. The narrowed portion was 3 mm in diameter, and 15 mm in length. The maximum value of stroke distortion of a tensile test machine was extended after fracture, and the maximum value of the tensile stress was measured as tensile strength. As a result, it is understood that the solder alloy A has tensile strength and extension after fracture which are more excellent than those in Example 1 in Related Art, in the environment of 175° C.

From the above descriptions, it is confirmed that the solder alloy A is not self-transformed even though repetitive exposure to a high temperature of 175° C. is performed, and the solder alloy A has excellent mechanical characteristics of a solder alloy, which refers to strength or ductility at a high temperature. Thus, it is possible to improve thermal fatigue resistance of a solder bonding portion.

Next, regarding the solder alloy in the exemplary embodiment, an alloy composition for exhibiting the effect will be described.

(In Content Percentage and Sb Content Percentage)

Firstly, the In content percentage and the Sb content percentage in the solder alloy will be described.

In a solder alloy in which Sn is used as the main component, an alloy (β-Sn phase) in which Sn is subjected to solid solution in In is formed in a low In-content-percentage range in which the In content percentage is equal to or less than about 15 mass %.

Solid solution is a phenomenon that a portion of crystal lattice of parent metal is replaced with a solid solution element at an atom level. As a general effect of the solid solution element, a difference of an atom diameter a parent metal and the solid solution element causes distortion to occur in crystal lattice of the parent element, and thus it is possible to suppress movement of crystal defects such as transition, when stress is applied. As a result, it is possible to improve strength of metal, and to degrade ductility when stress is applied. Strength of a solder alloy by solid solution is improved more as the content percentage of the solid solution element is increased.

However, in a case where In is subjected to solid solution in Sn solder, phase transformation occurs in accordance with the In content percentage. However, in a case where the temperature is gradually increased, when the temperature is increased to be equal to or higher than about 100° C., phase transformation from the β-Sn phase to a γ phase ($InSn_4$) having a different structure proceeds. That is, a state (γ+β-Sn) where two different phases of the same degree coexist occurs. The two-phase coexistence state occurs, and thus contribution of slipping at a particle boundary becomes large, and ductility at a high temperature is improved.

In a case where the In content percentage is large, transformation from the β-Sn phase to the γ phase excessively occurs.

In this case, since the volume of a crystal lattice structure of the γ phase is different from the volume of a crystal lattice structure of the β-Sn phase, a repetitive heat cycle is performed, and thus self-transformation of the solder alloy occurs. This causes breaking in the inside of the solder bonding portion or causes a short circuit between different solder bonding portions. Thus, this is a problem.

Sb raises the transformation temperature in a Sn—In alloy, for example, as with the transformation temperature 165° C. in Example 1 in Related Art and the transformation temperature 175° C. of the solder alloy A which are described above.

This is because a state of an alloy structure is changed by the Sb content. In a case where the Sb content percentage is relatively small, Sb is subjected to solid solution in Sn in a Sn—In alloy, similarly to In. Further, if the Sb content percentage is large, Sb forms a compound (InSb) along with In, and is precipitated in an alloy structure.

Sb along with In is subjected to solid solution in Sn, and thus element movement of Sn or In when the temperature is changed is suppressed, and a transformation starting temperature of the β-Sn phase and the γ phase is changed.

Sb is subjected to solid solution, and thus the mechanical characteristics of a solder alloy causes strength of the solder alloy to be improved similar to that in In solid solution. In addition, although will be described later, the inventors newly find that solid solution of Sb accelerates improvement of ductility at a high temperature, which is viewed in a case of a specific In content percentage.

Further, if the Sb content percentage is large, InSb is precipitated between crystal structures, like a pin, and thus transformation is suppressed. Meanwhile, since precipitation of InSb degrades ductility, excessive precipitation of InSb is inappropriate for improving thermal fatigue resistance.

In order to clarify an influence of a Sn—In solder alloy on the transformation temperature by the Sb content percentage, a solder alloy having a metal composition shown in Table 1 was manufactured and evaluated. A manufacturing method of the solder alloy is similar to the above descriptions.

TABLE 1

| | Metal composition (mass %) | | | | | | Transformation temperature (° C.) | | 175° C. | | | | Total determination |
|---|---|---|---|---|---|---|---|---|---|---|---|---|---|
| | Sn | Ag | Bi | In | Cu | Sb | Co | | | Tensile strength (MPa) | | Extension (%) | | |
| Example 1-1 | bal. | 3.5 | 0.5 | 6.0 | 0.8 | 0.50 | 0.016 | 175 | B | 8.1 | B | 210 | A | A |
| Example 1-2 | bal. | 3.5 | 0.5 | 6.0 | 0.8 | 0.75 | 0.016 | 180 | B | 8.1 | B | 200 | A | A |
| Example 1-3 | bal. | 3.5 | 0.5 | 6.0 | 0.8 | 1.00 | 0.016 | 185 | B | 8.2 | B | 175 | A | A |
| Example 1-4 | bal. | 3.5 | 0.5 | 6.0 | 0.8 | 1.25 | 0.016 | 186 | B | 8.5 | B | 105 | B | B |

TABLE 1-continued

| | Metal composition (mass %) | | | | | | Transformation temperature | | 175° C. | | | | Total determination |
|---|---|---|---|---|---|---|---|---|---|---|---|---|---|
| | | | | | | | | | Tensile strength | | Extension | | |
| | Sn | Ag | Bi | In | Cu | Sb | Co | (° C.) | | (MPa) | | (%) | |
| Comparative Example 1-1 | bal. | 3.5 | 0.5 | 6.0 | 0.8 | — | 0.016 | 165 | C | 8.0 | C | 103 | B | C |
| Comparative Example 1-2 | bal. | 3.5 | 0.5 | 6.0 | 0.8 | 0.25 | 0.016 | 168 | C | 8.0 | C | 181 | A | C |
| Comparative Example 1-3 | bal. | 3.5 | 0.5 | 6.0 | 0.8 | 1.50 | 0.016 | 187 | B | 9.0 | B | 90 | C | C |
| Example 1 in Related Art | bal. | 3.5 | 0.5 | 6.0 | 0.5 | — | — | 165 | — | 8.0 | — | 91 | — | — |

(in Table 1, "bal." indicates the remainder. This is set to be similar in the following Tables 2 to 6.)

In Table 1, regarding the transformation temperature of the manufactured solder alloy, a case of being equal to or higher than 175° C. was evaluated to be "B", and a case of being lower than 175° C. was evaluated to be "C". Regarding the mechanical characteristics (tensile strength and extension) at 175° C., a case of being improved in comparison to a case of Example 1 in Related Art was evaluated to be "B", and a case of being equivalent or less was evaluated to be "C". In particle, a case where extension at 175° C. was improved by 30% or more was evaluated to be "A". It is assumed that this is set to be similar in the following Tables 2 to 5.

In Table 1, the transformation temperature of the manufactured solder alloy, and the mechanical characteristics (tensile strength and extension) thereof at 175° C. were evaluated, and results were shown together. A case where the transformation temperature is equal to or higher than 175° C., and the mechanical characteristics are improved in comparison to a case of Example in Related Art is determined to be "B". In particle, a case where extension at 175° C. is 170% or more is determined to be "A". Thus, it is determined that the effect of the exemplary embodiment was exhibited. A case where the transformation temperature is lower than 175° C. or the value of the mechanical characteristics is less than the value in a case of Example in Related Art is determined to be "C". It is assumed that this is set to be similar in the following Tables 2 to 5.

Table 1 shows results of the total determination together. Regarding a transformation temperature, tensile strength, and extension, a case where a determination "C" is not provided and one or more determinations of "A" are provided is set to be the total determination of "A". A case where a determination of "C" is not provided, and a determination of "A" is not included is set to be the total determination of "B". A case where one or more determinations of "C" are included is set to be the total determination of "C". It is assumed that this is set to be similar in the following Tables 2 to 5.

As in Examples 1-1 to 1-4, in a case where 0.50 to 1.25 mass % of Sb is contained, the transformation temperature is equal to or higher than 175° C., the mechanical characteristics are improved, and the effect of the exemplary embodiment is exhibited. In a case where the Sb content percentage described in Comparative Examples 1-1 and 1-2 is equal to or less than 0.25 mass %, the mechanical characteristics at 175° C. is good. However, an increase of the transformation temperature is insufficient, and the transformation temperature is lower than 175° C., and thus the total determination is "C". In a case where the Sb content percentage described in Comparative Example 1-3 is 1.5 mass %, InSb is significantly generated. Thus, ductility at a high temperature is deteriorated, and the total determination is "C".

With the results shown in Table 1, it is understood that the effect of the exemplary embodiment is exhibited in a case where the Sb content percentage is in a range of 0.5 mass % to 1.25 mass %.

From Examples 1-1 to 1-4 and Comparative Example 1-1, it is understood that the Sb content percentage in a case of not containing Sb, and an increase of the transformation temperature has a relationship as represented by the following formula (1).

In a case of $0.5 \leq [Sb] \leq 1.0$:

$$\Delta Tt = 20 \times [Sb]$$

In a case of $1.0 < [Sb] \leq 1.25$:

$$\Delta Tt = 4 \times [Sb] + 16 \quad \text{(Formula 1)}$$

(In the formula, $\Delta Tt$ indicates an increase quantity (° C.) of the transformation temperature).

Then, in order to clarify an influence of the In content percentage, a solder alloy having a metal composition shown in Table 2 was manufactured and evaluated. The Sb content percentage is set to 0.50 mass % which is the smallest in the above descriptions, and the manufacturing method and the evaluation method of a solder alloy are similar to those in the above descriptions.

TABLE 2

| | Metal composition (mass %) | | | | | | | Transformation temperature | 175° C. | | | | Total determination |
|---|---|---|---|---|---|---|---|---|---|---|---|---|---|
| | | | | | | | | | Tensile strength | | Extension | | |
| | Sn | Ag | Bi | In | Cu | Sb | Co | (° C.) | (MPa) | | (%) | | |
| Example 2-1 | bal. | 3.5 | 0.5 | 5.5 | 0.8 | 0.50 | 0.016 | 185 | B | 8.0 | B | 199 | A | A |
| Example 2-2 | bal. | 3.5 | 0.5 | 6.0 | 0.8 | 0.50 | 0.016 | 175 | B | 8.1 | B | 210 | A | A |

TABLE 2-continued

| | Metal composition (mass %) | | | | | | Transformation temperature | 175° C. | | | | | Total determination |
|---|---|---|---|---|---|---|---|---|---|---|---|---|---|
| | | | | | | | | Tensile strength | | Extension | | | |
| | Sn | Ag | Bi | In | Cu | Sb | Co | (° C.) | (MPa) | | (%) | | |
| Comparative Example 2-1 | bal. | 3.5 | 0.5 | 5.0 | 0.8 | 0.50 | 0.016 | 194 | B | 7.9 | C | 105 | B | C |
| Comparative Example 2-2 | bal. | 3.5 | 0.5 | 6.5 | 0.8 | 0.50 | 0.016 | 166 | C | 8.2 | B | 172 | A | C |
| Comparative Example 2-3 | bal. | 3.5 | 0.5 | 7.0 | 0.8 | 0.50 | 0.016 | 156 | C | 8.0 | B | 123 | B | C |
| Comparative Example 2-4 | bal. | 3.5 | 0.5 | 7.5 | 0.8 | 0.50 | 0.016 | 147 | C | 8.1 | B | 89 | C | C |
| Example 1 in Related Art | bal. | 3.5 | 0.5 | 6.0 | 0.5 | — | — | 165 | — | 8.0 | — | 91 | — | — |

As shown in Table 2, it is understood that, if Example 2-2 and Example 1 in Related Art are compared to each other, the transformation temperature is increased by the Sb content. Example 2-2 is a case where the Sb content percentage is 0.5 mass %. In a case where the Sb content percentage is 0.5 mass %, in Examples 2-1 and 2-2 in which the In content percentage is 5.5 mass % and 6.0 mass %, respectively, any of the transformation temperature and the mechanical characteristics (tensile strength and extension) at 175° C. is improved. The transformation temperature is lowered with an increase of the In content percentage. In Comparative Examples 2-2 and 2-3 in which the In content percentage is 6.5 mass % and 7.0 mass % respectively, the mechanical characteristics at a high temperature are good. However, the transformation temperature is lower than 175° C., and thus the total determination is "C". Further, in Comparative Example 2-4 in which the In content percentage is large, that is, 7.5 mass %, the transformation temperature and the mechanical characteristics at 175° C. together are insufficient. Thus, the total determination is "C". From a result of evaluation of the mechanical characteristics (tensile strength and extension), in Comparative Example 2-1 in which the In content percentage is 5.0 mass %, the tensile strength at 175° C. is smaller than that in Example 1 in Related Art in which the effect by solid solution of In is small, and thus the total determination is "C".

Then, as shown in Table 3, in a case where the Sb content percentage is set to be an upper limit, that is, 1.25 mass %, a solder alloy was manufactured and evaluated. The manufacturing method and the evaluation method of a solder alloy are similar to those in the above descriptions.

TABLE 3

| | Metal composition (mass %) | | | | | | | Transformation temperature | 175° C. | | | | | Total determination |
|---|---|---|---|---|---|---|---|---|---|---|---|---|---|---|
| | | | | | | | | | Tensile strength | | Extension | | | |
| | Sn | Ag | Bi | In | Cu | Sb | Co | (° C.) | (MPa) | | (%) | | | |
| Example 3-1 | bal. | 3.5 | 0.5 | 5.5 | 0.8 | 1.25 | 0.016 | 195 | B | 8.2 | B | 110 | B | B |
| Example 3-2 | bal. | 3.5 | 0.5 | 6.0 | 0.8 | 1.25 | 0.016 | 186 | B | 8.5 | B | 115 | B | B |
| Example 3-3 | bal. | 3.5 | 0.5 | 6.5 | 0.8 | 1.25 | 0.016 | 176 | B | 8.6 | B | 117 | B | B |
| Comparative Example 3-1 | bal. | 3.5 | 0.5 | 5.0 | 0.8 | 1.25 | 0.016 | 204 | B | 7.9 | C | 107 | B | C |
| Comparative Example 3-2 | bal. | 3.5 | 0.5 | 7.0 | 0.8 | 1.25 | 0.016 | 166 | C | 8.0 | B | 77 | C | C |
| Comparative Example 3-3 | bal. | 3.5 | 0.5 | 7.5 | 0.8 | 1.25 | 0.016 | 157 | C | 8.0 | B | 70 | C | C |
| Example 1 in Related Art | bal. | 3.5 | 0.5 | 6.0 | 0.5 | — | — | 165 | — | 8.0 | — | 91 | — | C |

As shown in Table 3, it is understood that, if Example 3-2 and Example 1 in Related Art are compared to each other, the transformation temperature is increased by the Sb content. Similarly to a case of the result shown in Table 2, the transformation temperature is lowered with an increase of the In content percentage. In Comparative Examples 3-2 and 3-3 in which the In content percentage is equal to or higher than 7.0 mass %, the transformation temperature is lower than 175° C., and thus total the determination is "C". Focusing on the mechanical characteristics of the tensile strength and extension, in a case of Comparative Example 3-1 in which the In content percentage is 5.0 mass %, the solid-solution effect of In is not sufficiently exhibited, and the tensile strength at 175° C. is smaller than that in Example 1 in Related Art. Thus, the total determination is "C".

The range of the In content percentage for exhibiting the effect of the exemplary embodiment is as follows, based on the results shown in Tables 2 and 3.

In a case where the Sb content percentage is 0.5≤[Sb]≤1.25, focusing on a relationship between the In content percentage and the mechanical characteristics is attracted, it is necessary that the In content percentage is equal to or more than 5.5 mass %, for exhibiting the effect of the exemplary embodiment, and the relationship of (Formula 2) is provided.

$$[In] \geq 5.5 \qquad \text{(Formula2)}$$

Next, a relationship between the In content percentage and the transformation temperature will be attracted.

Figure 2:
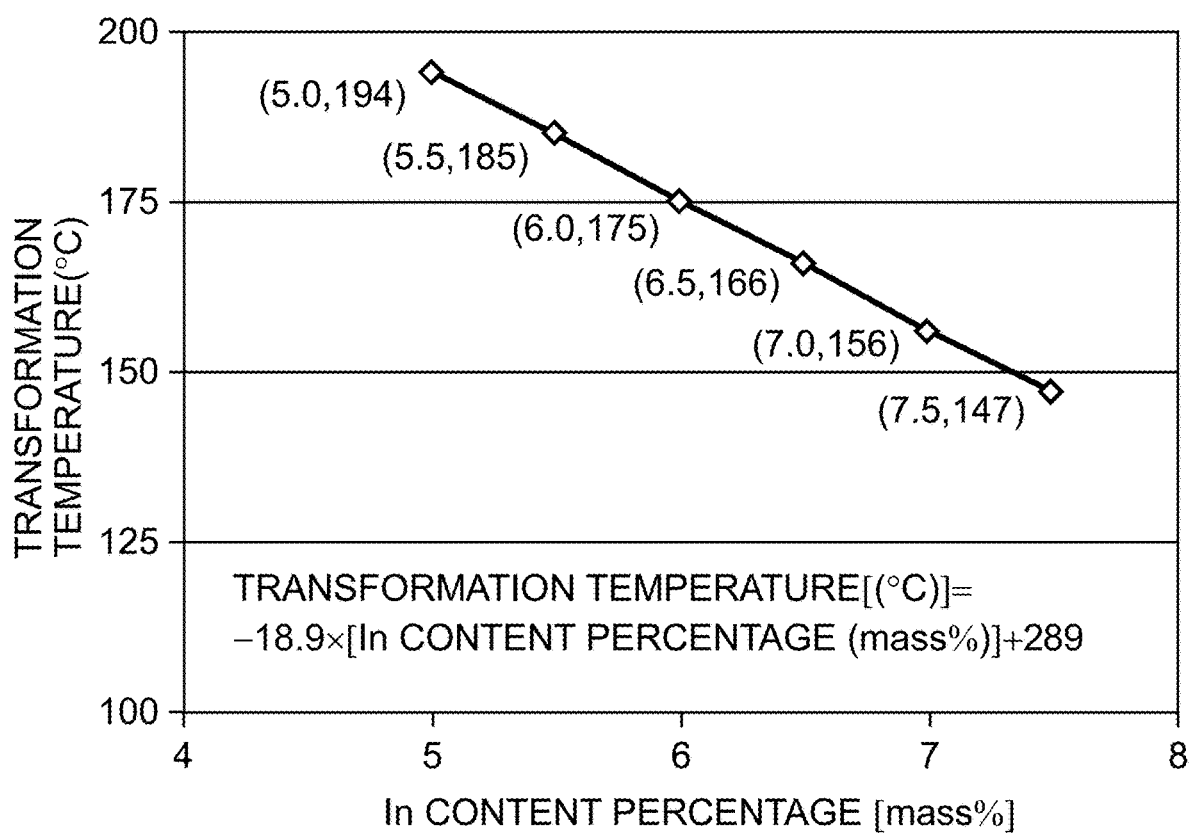
FIG. 2 is a diagram illustrating a relationship (in a case where a Sb content percentage is 0.5 mass %) between an In content percentage and a transformation temperature of the solder alloy according to the exemplary embodiment.

FIG. 2 is a diagram illustrating a relationship between the In content percentage and the transformation temperature in a case where the Sb content percentage shown in Table 2 is 0.50 mass %. In FIG. 2, a horizontal axis indicates the Sb content percentage, and a vertical axis indicates the transformation temperature.

In a case where the Sb content percentage is 0.50 mass %, the relationship between the In content percentage and the transformation temperature is a relationship of the following Formula 3.

$$Tt = -18.9 \times [\text{In}] + 289 \quad \text{(Formula 3)}$$

(In the formula, Tt indicates the transformation temperature (° C.))

With Formula 1, the transformation temperature rising effect by the Sb content is 10° C. Thus, in a case of not containing Sb, a relationship as shown in the following Formula 4 is provided.

$$Tt = -18.9 \times [\text{In}] + 279 \quad \text{(Formula 4)}$$

(In the formula, Tt indicates the transformation temperature (° C.))

From the results, a relationship as shown in Formula 5 is required for exhibiting the effect of the exemplary embodiment, in which the transformation temperature is equal to or higher than 175° C., and the mechanical characteristics of a solder alloy are improved.

In a case of $5.5 \leq [\text{In}] \leq 6.5$ and $0.5 \leq [\text{Sb}] \leq 1.0$:

$$-18.9 \times [\text{In}] + 279 + 20 \times [\text{Sb}] \geq 175$$

In a case of $1.0 < [\text{Sb}] \leq 1.25$:

$$-18.9 \times [\text{In}] + 279 + 4 \times [\text{Sb}] + 16 \geq 175 \quad \text{(Formula 5)}$$

With Formulas 1, 2, and 5, the In content percentage (mass %) and the Sb content percentage (mass %) for exhibiting the effect of the present disclosure are required to satisfy a relationship of the following Formula 6.

In a case of $0.5 \leq [\text{Sb}] \leq 1.25$ and $0.5 \leq [\text{Sb}] \leq 1.0$:

$$5.5 \leq [\text{In}] \leq 5.50 + 1.06 \times [\text{Sb}]$$

In a case of $1.0 < [\text{Sb}] \leq 1.25$:

$$5.5 \leq [\text{In}] \leq 6.35 + 0.212 \times [\text{Sb}] \quad \text{(Formula 6)}$$

In order to clarify a composition range for particularly exhibiting improvement of ductility at a high temperature, which is one of the effects of the exemplary embodiment, as shown in Table 4, a solder alloy of an In content satisfying the relationship of Formula 6 in a case where the Sb content percentage is 0.75 mass % and 1.0 mass % is manufactured and a relationship with the In content is evaluated in detail. The manufacturing method and the evaluation method of a solder alloy are similar to those in the above descriptions.

TABLE 4

| | Metal composition (mass %) | | | | | | Transformation temperature | 175° C. | | | | | Total determination |
|---|---|---|---|---|---|---|---|---|---|---|---|---|---|
| | | | | | | | | | Tensile strength (MPa) | | Extension (%) | | |
| | Sn | Ag | Bi | In | Cu | Sb | Co | (° C.) | | | | | |
| Example 4-1 | bal. | 3.5 | 0.5 | 6.0 | 0.8 | 0.75 | 0.016 | 180 | B | 8.1 | B | 186 | A | A |
| Example 4-2 | bal. | 3.5 | 0.5 | 6.1 | 0.8 | 0.75 | 0.016 | 179 | B | 8.1 | B | 174 | A | A |
| Example 4-3 | bal. | 3.5 | 0.5 | 6.2 | 0.8 | 0.75 | 0.016 | 177 | B | 8.2 | B | 140 | B | B |
| Example 4-4 | bal. | 3.5 | 0.5 | 6.0 | 0.8 | 1.00 | 0.016 | 185 | B | 8.2 | B | 173 | A | A |
| Example 4-5 | bal. | 3.5 | 0.5 | 6.1 | 0.8 | 1.00 | 0.016 | 184 | B | 8.2 | B | 171 | A | A |
| Example 4-6 | bal. | 3.5 | 0.5 | 6.2 | 0.8 | 1.00 | 0.016 | 182 | B | 8.2 | B | 140 | B | B |
| Example 4-7 | bal. | 3.5 | 0.5 | 6.3 | 0.8 | 1.00 | 0.016 | 180 | B | 8.3 | B | 135 | B | B |
| Example 4-8 | bal. | 3.5 | 0.5 | 6.4 | 0.8 | 1.00 | 0.016 | 178 | B | 8.3 | B | 130 | B | B |
| Example 4-9 | bal. | 3.5 | 0.5 | 6.5 | 0.8 | 1.00 | 0.016 | 176 | B | 8.4 | B | 128 | B | B |
| Example 1 in Related Art | bal. | 3.5 | 0.5 | 6.0 | 0.5 | — | — | 165 | — | 8.0 | — | 91 | — | — |

As shown in Table 4, even in a case of any of Examples, the transformation temperature and the mechanical characteristics are improved in comparison to Example 1 in Related Art. Focusing on the extension at 175° C., it is understood that the extension indicates a higher value as the In content percentage becomes smaller, in a range of the In content percentage which is equal to or more than 6.0 mass %.

With the result shown in Table 4, in order to exhibit the effect of the exemplary embodiment, it is desirable that the In content and a Sb content satisfy a relationship of the following Formula 7.

$$0.5 \leq [\text{Sb}] \leq 1.0,\ 5.5 \leq [\text{In}] \leq 5.50 + 1.06 \times [\text{Sb}],\ \text{and}\ [\text{In}] \leq 6.5 \quad \text{(Formula 7)}$$

More preferably, a relationship of the following Formula 8

$$0.5 \leq [\text{Sb}] \leq 1.0,\ 5.5 \leq [\text{In}] \leq 5.50 + 1.06 \times [\text{Sb}],\ \text{and}\ [\text{In}] \leq 6.1 \quad \text{(Formula 8)}$$

(Co Content Percentage)

It is understood that, if Example 1-2 and Comparative Example 1-1 in Table 1 are compared to each other, extension at 175° C. is increased, and thus, in a Sn solder alloy which contains In, ductility at a high temperature is improved when Sb is contained in a predetermined range. The inventors newly found that, in a Sn solder alloy containing In, improvement of ductility at such a high temperature, which occurred when Sb was contained in a predetermined range was accelerated further in a case where Co was contained at a predetermined content percentage.

In order to clarify an influence of the Co content percentage, a solder alloy having a metal composition shown in Table 5 was manufactured and evaluated. The manufacturing method and the evaluation method of a solder alloy are similar to those in the above descriptions.

TABLE 5

| | Metal composition (mass %) | | | | | | Transformation temperature | 175° C. | | | Total |
|---|---|---|---|---|---|---|---|---|---|---|---|
| | | | | | | | | Tensile strength | Extension | | |
| | Sn | Ag | Bi | In | Cu | Sb | Co | (° C.) | (MPa) | (%) | determination |
| Example 5-1 | bal. | 3.5 | 0.5 | 6.0 | 0.8 | 0.50 | 0.025 | 175 B | 8.1 B | 186 A | A |
| Example 5-2 | bal. | 3.5 | 0.5 | 6.0 | 0.8 | 0.50 | 0.016 | 175 B | 8.1 B | 210 A | A |
| Example 5-3 | bal. | 3.5 | 0.5 | 6.0 | 0.8 | 0.50 | 0.010 | 175 B | 8.2 B | 181 A | A |
| Example 5-4 | bal. | 3.5 | 0.5 | 6.0 | 0.8 | 0.50 | — | 175 B | 8.1 B | 169 B | B |
| Comparative Example 5-1 | bal. | 3.5 | 0.5 | 6.0 | 0.8 | 0.50 | 0.030 | 175 B | 8.2 B | 90 C | C |
| Example 1 in Related Art | bal. | 3.5 | 0.5 | 6.0 | 0.5 | — | — | 165 — | 8.0 — | 91 — | — |

If Examples 5-4 and 5-1 are compared to each other, it is understood that the containing of Co does not cause the transformation temperature to be changed. In a case where the In content percentage is 6.0 mass %, in Examples 5-1, 5-2, and 5-3 in which the Co content percentage is 0.025 mass %, 0.016 mass %, and 0.010 mass %, respectively, the mechanical characteristics (tensile strength and extension) at 175° C. in all of the examples are improved in comparison to those in Example 5-4.

As described above, in a Sn solder alloy containing In, in a case where 0.010 mass % or more of Co is contained, an effect of improving ductility can be sufficiently confirmed. Thus, the Co content percentage is desirably 0.010 mass % or more.

In Comparative Example 5-1 in which the Co content percentage is 0.030 mass %, extension at a high temperature was significantly decreased. Thus, the total determination was set to be "C". It is considered that this is because the Co content percentage is too much, and thus a Co compound is precipitated. Further, if Co is excessively contained, the melting point may be increased. Thus, the Co content percentage is desirably 0.025 mass % or less.

Accordingly, in the solder alloy according to the exemplary embodiment, a preferable range of the Co content percentage is 0.01 mass % or more and 0.025 mass % or less.

(Cu Content Percentage)

Cu is contained in order to lower a melting point in soldering and to improve selectivity of a material of a member to be bonded.

As the member to be bonded in soldering, a medium obtained by performing various types of plating or pre-flux treatment on Cu or Ni as a base material is mainly provided.

Among the substances, in a case where the base material of the member to be bonded is Ni, when soldering is performed by a solder alloy which contains In, and does not contain Cu or contains the small amount of Cu, some amount of In are taken in an interface reaction layer ($Ni_3Sn_4$). Thus, the mechanical characteristics at a solder bonding portion after soldering are changed. In a case where the base material of the member to be bonded is Ni, it is necessary that many of In are contained in advance, by the amount of In taken into the interface reaction layer. However, in a practical circuit board, various electronic components are mounted on one circuit board. Thus, in a case where electronic components in which the base material is Cu and Ni respectively are mounted, it is difficult that the In content percentage is adjusted in advance.

However, the predetermined amount of Cu is contained in the solder alloy, and thus Cu in the solder alloy during soldering forms a $Cu_6Sn_5$ alloy layer in the interface reaction layer. Thus, it is possible to prevent intake of In, and selectivity of a member to be bonded is improved.

It is clearly described in Japanese Patent Application No. 2013-245191 by this applicant, that the Cu content percentage is equal to or more than 0.5 mass % in order to exhibit such an effect of Cu containing. Thus, the lower limit value of the Cu content percentage is 0.5 mass %.

If Cu is excessively contained, the melting point is increased. Thus, being equal to or less than 1.2 mass % is desirable.

Thus, in the solder alloy according to the exemplary embodiment, the Cu content percentage is set to be 0.5 mass % or more and 1.2 mass % or less.

(Bi Content Percentage)

Bi is contained for the purpose of improving mechanical strength of a solder material, and of lowering the melting point. In a solder alloy, in a case where the Bi content percentage is relatively small, that is, equal to or less than 3.0 mass %, solid solution is formed to have the β-Sn phase. If the Bi content percentage is large, Bi is provided in a form in which a Bi compound is precipitated.

In order to obtain the effect of improving the mechanical strength by Bi containing, 0.1 mass % or more of Bi is necessarily contained, and 0.1 mass % or more of the Bi content percentage is desirably contained.

In a case where precipitation of Bi or a Bi compound occurs, action of preventing slipping at an interface is shown. Thus, the ductility at a high temperature is significantly degraded. Thus, it is desirable that an upper limit of the Bi content percentage is set to be equal to or less than 3.0 mass % in which precipitation of Bi or a Bi compound does not occur.

With the above descriptions, in the solder alloy of the exemplary embodiment, the Bi content percentage is set to be 0.1 mass % or more and 3.0 mass % or less.

(Ag Content Percentage)

Ag is contained for the purpose of improving wettability in soldering, and of lowering the melting point. In a solder alloy, Ag is provided in a form of a $Ag_3Sn$ compound and $Ag_2In$.

Generally, in order to uniquely melt a solder alloy by reflow soldering, a reflow peak temperature which is equal to or higher than +10° C. of a liquidus temperature of the solder alloy is preferably set. In addition, if a thermal-resistant temperature of an electronic component is considered, the reflow peak temperature is preferably set to be equal to or lower than 240° C.

Thus, the liquidus temperature of the solder alloy is preferably set to be equal to or lower than 230° C. In the solder alloy of the exemplary embodiment, the Ag content percentage is set to be 1.0 mass % or more and 4.0 mass % or less.

A solder alloys which has a metal composition shown in Table 6 was manufactured based on the content percentage of each element determined in the above-described manner and the thermal fatigue resistance and impact resistance were evaluated. A manufacturing method of the solder alloy is similar to the above descriptions.

An evaluation method of the thermal fatigue resistance is as follows.

Firstly, the manufactured solder alloy is machined to be solder powder having a particle diameter of tens μm, and the solder powder and a flux were weight to have a weight ratio of 90:10. The solder powder and the flux were kneaded, and thus a solder paste was manufactured. This solder paste was printed on a circuit board electrode on a circuit board by using a metal mask having a thickness of 15 μm. A chip resistor was mounted on the printed solder paste, and reflow heating was performed under a condition of the maximum 240° C. Thus, a package structure was manufactured. A base material of the used circuit board electrode of the circuit board was Cu and Ni.

The −40° C./175° C. temperature cycle test was performed on the package structure manufactured in such a manner, and transformation of a solder bonding portion after 2,000 cycles was visually observed. As a result of visual confirmation, a case where transformation was not recognized was determined to be "none", and a case where transformation was recognized was determined to be "transformation", and these determinations were shown in a field of self-transformation in Table 6. Electrical connection in a case where transformation was not recognized in visual observation was evaluated. A case where a change of a resistance value from that in the initial time was equal to or more than 10% was determined to be electrical poorness "provided". A case where the change did not occur or the change was equal to or less than 10% was determined to be electrical poorness "none". Results were shown in a field of electrical poorness in Table 6, for each base material of the used circuit board electrode. "−" in the field of the electrical poorness in Table 6 indicates that evaluation was not performed.

An evaluation method of the impact resistance is as follows.

Figure 3:
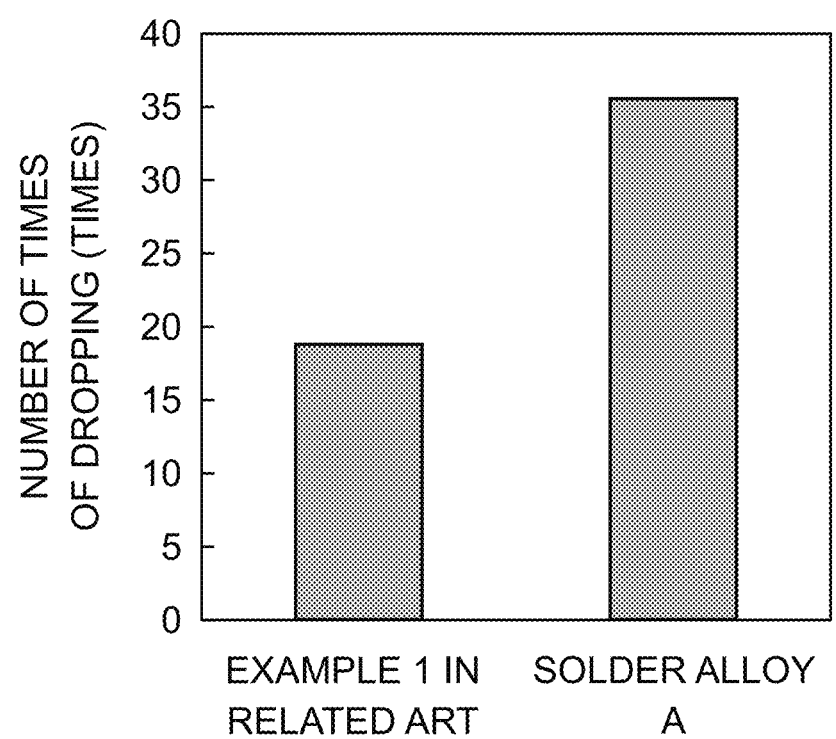
FIG. 3 is a diagram illustrating a drop test result of the solder alloy described in the exemplary embodiment under a high-temperature environment of 175° C.

A manufacturing method of a solder alloy and a package structure is similar to that in the above descriptions. A base material of the used circuit board electrode of the circuit board was Cu. The package structure manufactured in this manner was heated on a hot plate which has been set to 175° C. A test of dropping a weight of 500 g from a location having a height of 10 cm was performed, and the number of times of performing the test until a chip resistor was fallen was measured. A case where the number of times until the chip resistor was fallen was equal to or more than 30 times was set to be a falling determination of "A". A case where the number of times was 20 times or more and less than 30 times was set to be the falling determination of "B". A case of being less than 20 times was set to be the falling determination of "C". FIG. 3 illustrates results obtained by performing an impact resistance test. A vertical axis indicates the number of times of dropping the weight, and a horizontal axis indicates the name of the used solder.

TABLE 6

|  | Metal composition (mass %) | | | | | | | | Electrical poorness Circuit board electrode base material | | Falling determination |
| --- | --- | --- | --- | --- | --- | --- | --- | --- | --- | --- | --- |
|  | Sn | Ag | Bi | In | Cu | Sb | Co | Self-transformation | Cu | Ni |  |
| Example 5-1 | bal. | 3.5 | 0.5 | 5.5 | 0.8 | 0.50 | 0.016 | none | none | none | A |
| Example 5-2 | bal. | 3.5 | 0.5 | 5.5 | 0.8 | 1.00 | 0.016 | none | none | none | A |
| Example 5-3 | bal. | 3.5 | 0.5 | 5.5 | 0.8 | 1.25 | 0.016 | none | none | none | B |
| Example 5-4 | bal. | 3.5 | 0.5 | 6.0 | 0.8 | 0.50 | 0.016 | none | none | none | A |
| Example 5-5 | bal. | 3.5 | 0.5 | 6.0 | 0.8 | 1.00 | 0.016 | none | none | none | A |
| Example 5-6 | bal. | 3.5 | 0.5 | 6.0 | 0.8 | 1.25 | 0.016 | none | none | none | B |
| Example 5-7 | bal. | 3.5 | 0.5 | 6.5 | 0.8 | 1.25 | 0.016 | none | none | none | B |
| Example 5-8 | bal. | 3.5 | 0.5 | 6.0 | 0.5 | 0.50 | 0.016 | none | none | none | A |
| Example 5-9 | bal. | 3.5 | 0.5 | 6.0 | 1.2 | 0.50 | 0.016 | none | none | none | A |
| Example 5-10 | bal. | 3.5 | 0.1 | 6.0 | 0.8 | 0.50 | 0.016 | none | none | none | A |
| Example 5-11 | bal. | 3.5 | 3.0 | 6.0 | 0.8 | 0.50 | 0.016 | none | none | none | A |
| Example 5-12 | bal. | 1.0 | 0.5 | 6.0 | 0.8 | 0.50 | 0.016 | none | none | none | A |
| Example 5-13 | bal. | 4.0 | 0.5 | 6.0 | 0.8 | 0.50 | 0.016 | none | none | none | A |
| Example 5-14 | bal. | 3.5 | 0.5 | 6.0 | 0.8 | 0.50 | 0.01 | none | none | none | A |
| Example 5-15 | bal. | 3.5 | 0.5 | 6.0 | 0.8 | 0.50 | 0.025 | none | none | none | A |
| Example 5-16 | bal. | 3.5 | 0.5 | 6.0 | 0.8 | 0.50 | — | none | none | none | B |
| Comparative Example 5-1 | bal. | 3.5 | 0.5 | 6.0 | 0.8 | — | 0.016 | transformation | — | — | — |
| Comparative Example 5-2 | bal. | 3.5 | 0.5 | 6.0 | 0.8 | 1.5 | 0.016 | none | provided | provided | C |
| Comparative Example 5-3 | bal. | 3.5 | 0.5 | 5.0 | 0.8 | 0.50 | 0.016 | none | provided | provided | C |
| Comparative Example 5-4 | bal. | 3.5 | 0.5 | 7.0 | 0.8 | 0.50 | 0.016 | transformation | — | — | — |
| Comparative Example 5-5 | bal. | 3.5 | 0.5 | 6.0 | — | 0.50 | 0.016 | none | none | provided | C |
| Comparative Example 5-6 | bal. | 3.5 | 0.5 | 6.0 | 1.5 | 0.50 | 0.016 | none | provided | provided | C |
| Comparative Example 5-7 | bal. | 3.5 | — | 6.0 | 0.8 | 0.50 | 0.016 | none | provided | provided | C |
| Comparative Example 5-8 | bal. | 3.5 | 3.5 | 6.0 | 0.8 | 0.50 | 0.016 | none | provided | provided | C |

TABLE 6-continued

| | Metal composition (mass %) | | | | | | | Electrical poorness Circuit board electrode base material | | Falling |
| | Sn | Ag | Bi | In | Cu | Sb | Co | Self-transformation | Cu | Ni | determination |
|---|---|---|---|---|---|---|---|---|---|---|---|
| Comparative Example 5-9 | bal. | — | 0.5 | 6.0 | 0.8 | 0.50 | 0.016 | none | provided | provided | C |
| Example 1 in Related Art | bal. | 3.5 | 0.5 | 6.0 | 0.5 | — | — | transformation | — | — | — |
| Example 2 in Related Art | bal. | 3.5 | 0.5 | 8.0 | 0.5 | — | — | transformation | — | — | — |

As shown in Table 6, in Examples 5-1 to 5-16 included in the composition range of a solder alloy, which was determined in the above-described manner, self-transformation at a solder bonding portion did not occur and electrical poorness of a short circuit or disconnection did not occur. Among the examples, the number of times until a chip resistor was fallen was 30 times or more in Examples 5-1 and 5-2, Examples 5-4 and 5-5, and Examples 5-8 to 5-15.

In Comparative Examples 5-1 to 5-4 having different In and Sb content percentages, any of the self-transformation at a solder bonding portion and the electrical poorness occurred.

In Comparative Example 5-5 in which Cu was not contained, the self-transformation at a solder bonding portion did not occur. In a case where the base material of a circuit board electrode is Ni, disconnection occurred.

In Comparative Example 5-6 in which the Cu content percentage was 1.5 mass %, Comparative Example 5-7 in which Bi was not contained, Comparative Example 5-8 in which the Bi content percentage was 3.5 mass %, and Comparative Example 5-9 in which Ag was not contained, the electrical poorness occurred.

In all of Examples 1 and 2 in Related Art, the self-transformation at a solder bonding portion occurred.

Thus, from evaluation results shown in Tables 1 to 4, in a solder alloy in which 0.5 mass % or more and 1.25 mass % or less of Sb, In satisfying the following formula (I) or (II): in a case of $0.5 \leq [Sb] \leq 1.0$, $5.5 \leq [In] \leq 5.50+1.06[Sb]$ ... (I), in a case of $1.0 < [Sb] \leq 1.25$, $5.5 \leq [In] \leq 6.35+0.212[Sb]$ ... (II) (in the formula, [Sb] indicates a Sb content percentage (mass %) and [In] indicates an In content percentage (mass %)), 0.5 mass % or more and 1.2 mass % or less of Cu, 0.1 mass % or more and 3.0 mass % or less of Bi, 1.0 mass % or more and 4.0 mass % or less of Ag, and 0 mass % or more and 0.025 mass % or less of Co were contained, and the remainder consisted essentially of Sn, showing the effect of the exemplary embodiment was confirmed. The solder alloy can be configured by an alloy structure which contains the γ phase in which Sb was subjected to solid solution, and the β-Sn phase at 150° C. or higher. Even in the environment of 175° C., a bonding portion having excellent thermal fatigue resistance can be formed.

More desirably, the solder alloy contains 0.5 mass % or more and 1.0 mass % or less of Sb, In satisfying the following Formula (I): $5.5 \leq [In] \leq 5.50+1.06[Sb]$ ... (I), 0.5 mass % or more and 1.2 mass % or less of Cu, 0.1 mass % or more and 3.0 mass % or less of Bi, 1.0 mass % or more and 4.0 mass % or less of Ag, and 0 mass % or more and 0.025 mass % or less of Co, and the remainder consists essentially of Sn. The solder alloy can be configured by an alloy structure which contains the γ phase in which Sb was subjected to solid solution, and the β-Sn phase at 150° C. or higher. Even in the environment of 175° C., a bonding portion having more excellent thermal fatigue resistance can be formed.

Further desirably, the solder alloy contains In satisfying $0.5 \leq [Sb] \leq 1.0$, $5.5 \leq [In] \leq 5.50+1.06[Sb]$, and $[In] \leq 6.1$ (in the formula, [Sb] indicates a Sb content percentage (mass %) and [In] indicates an In content percentage (mass %)), 0.5 mass % or more and 1.2 mass % or less of Cu, 0.1 mass % or more and 3.0 mass % or less of Bi, 1.0 mass % or more and 4.0 mass % or less of Ag, and 0.01 mass % or more and 0.025 mass % or less of Co, and the remainder consists essentially of Sn. The solder alloy can be configured by an alloy structure which contains the γ phase in which Sb was subjected to solid solution, and the β-Sn phase at 150° C. or higher. Even in the environment of 175° C., a bonding portion which is particularly excellent in thermal fatigue resistance and impact resistance can be formed.

In the package structure according to the disclosure, electrodes of an electronic component and a circuit board are bonded to each other by the above-described solder alloy. According to this, even in the environment of 175° C., it is possible to provide a package structure having bonding which is more excellent in thermal fatigue resistance and impact resistance.

As the electronic component and the circuit board, any may be used. The electrode portion of an electronic component and the electrode portion of a circuit board may be formed from an appropriate conductive material. The portions may contain Cu and/or Ni as described above as a member to be bonded.

The solder alloy may have any form. The solder alloy may be used singly (for example, in a form of powder, thread solder, a molten liquid, and preform solder) in soldering, or may be used integrally with a flux (for example, in a form of a solder paste, or cored solder) in soldering. Conditions of soldering may be appropriately selected.

According to the solder alloy and the package structure of the disclosure, it is possible to realize bonding which having excellent mechanical characteristics even in a high-temperature environment of 175° C. For example, the solder alloy is used in a package structure and the like for electric components for a vehicle, which needs ensuring of electric conduction for a long term in a high-temperature environment, such as an engine room. Thus, the solder alloy and the package structure are useful.

What is claimed is:
1. A solder alloy consisting of:
0.5 mass % or more and 0.75 mass % or less of Sb;
In satisfying the following formula (I) when [Sb] is set as a Sb content percentage (mass %) and [In] is set as an In content percentage (mass %), in a case of 0.5≤[Sb]≤0.75

$$5.5 \leq [In] \leq 5.50 + 1.06[Sb] \quad (I)$$

0.5 mass % or more and 1.2 mass % or less of Cu;
0.1 mass % or more and 3.0 mass % or less of Bi;
1.0 mass % or more and 4.0 mass % or less of Ag; and
0.01 mass % or more and 0.025 mass % or less of Co; and
having a remainder of Sn.

2. The solder alloy of claim 1,
wherein 0.5 mass % or more and 0.75 mass % or less of Sb,
In satisfying the following formula (III) and (IV) when [Sb] is set as the Sb content percentage (mass %) and [In] is set as the In content percentage (mass %):

$$5.5 \leq [In] \leq 5.50 + 1.06[Sb] \quad (III)$$

$$[In] \leq 6.1 \quad (IV)$$

0.5 mass % or more and 1.2 mass % or less of Cu,
0.1 mass % or more and 3.0 mass % or less of Bi,
1.0 mass % or more and 4.0 mass % or less of Ag, and
0.01 mass % or more and 0.025 mass % or less of Co are contained, and the remainder of Sn.

3. The solder alloy of claim 1, comprising: an alloy structure at 150° C. or higher, the alloy structure containing a γ phase in which Sb is subjected to solid solution, and a β-Sn phase.

4. The solder alloy of claim 2, comprising:
an alloy structure at 150° C. or higher, the alloy structure containing a γ phase in which Sb is subjected to solid solution, and a β-Sn phase.

5. A package structure in which an electronic component is mounted in a circuit board,
wherein an electrode portion of the electronic component and an electrode portion of the circuit board are bonded to each other by the solder alloy of claim 1.

* * * * *